US009435826B2

(12) United States Patent
Johnson et al.

(10) Patent No.: US 9,435,826 B2
(45) Date of Patent: Sep. 6, 2016

(54) VARIABLE SPACING FOUR-POINT PROBE PIN DEVICE AND METHOD

(71) Applicant: KLA-Tencor Corporation, Milpitas, CA (US)

(72) Inventors: Walter H. Johnson, Rocklin, CA (US); Jianou Shi, Milpitas, CA (US); Lansheng Dong, Shanghai (CN); Haijing Peng, Shanghai (CN); Xianghua Liu, Shanghai (CN); Jiazhou Jin, Shanghai (CN); Zhuoxian Zhang, Shanghai (CN); Nanchang Zhu, Shanghai (CN)

(73) Assignee: KLA-Tencor Corporation, Milpitas, CA (US)

( * ) Notice: Subject to any disclaimer, the term of this patent is extended or adjusted under 35 U.S.C. 154(b) by 643 days.

(21) Appl. No.: 13/888,201

(22) Filed: May 6, 2013

(65) Prior Publication Data

US 2013/0300445 A1 Nov. 14, 2013

Related U.S. Application Data

(60) Provisional application No. 61/644,009, filed on May 8, 2012.

(51) Int. Cl.
*G01R 31/20* (2006.01)
*G01R 1/067* (2006.01)
*G01R 1/073* (2006.01)

(52) U.S. Cl.
CPC ....... *G01R 1/06711* (2013.01); *G01R 1/06794* (2013.01); *G01R 1/073* (2013.01); *G01R 1/06733* (2013.01)

(58) Field of Classification Search
CPC .......... G01R 1/06711; G01R 1/06794; G01R 1/073
See application file for complete search history.

(56) References Cited

U.S. PATENT DOCUMENTS

| | | | |
|---|---|---|---|
| 3,286,324 A | 11/1966 | Hautau | |
| 5,214,389 A * | 5/1993 | Cao ..................... | G01R 1/06705 324/713 |
| 6,040,705 A * | 3/2000 | Garcia ..................... | H01H 1/16 324/755.07 |
| 6,815,959 B2 | 11/2004 | Johnson et al. | |
| 7,050,160 B1 | 5/2006 | Johnson et al. | |
| 7,099,007 B2 | 8/2006 | Hovinen et al. | |
| 7,106,446 B2 | 9/2006 | Nicolaides et al. | |
| 2008/0143354 A1 | 6/2008 | Chen et al. | |
| 2009/0261817 A1 | 10/2009 | Beom et al. | |

FOREIGN PATENT DOCUMENTS

| | | |
|---|---|---|
| CN | 101164138 A | 4/2008 |
| CN | 101470168 A | 7/2009 |

(Continued)

*Primary Examiner* — Daniel Miller
(74) *Attorney, Agent, or Firm* — Simpson & Simpson, PLLC

(57) ABSTRACT

A continuous variable spacing probe pin device, including first and second probe pins. The first and second probe pins are configured to measure a property of a conductive layer. In a first configuration, the first and second probe pins include respective first portions arranged to contact the conductive layer to measure the property. In a second configuration, the first and second probe pins include respective second portions arranged to contact the conductive layer to measure the property. A first area for each respective first portion is different from a second area for each respective second portion.

14 Claims, 15 Drawing Sheets

(56) References Cited

FOREIGN PATENT DOCUMENTS

| EP | 1243915 | A1 | 9/2002 |
| JP | 2000232050 | A | 8/2000 |
| JP | 2010114146 | A | 5/2010 |
| KR | 100885877 | B1 | 2/2009 |
| RU | 89716 | U1 | 10/2009 |

\* cited by examiner

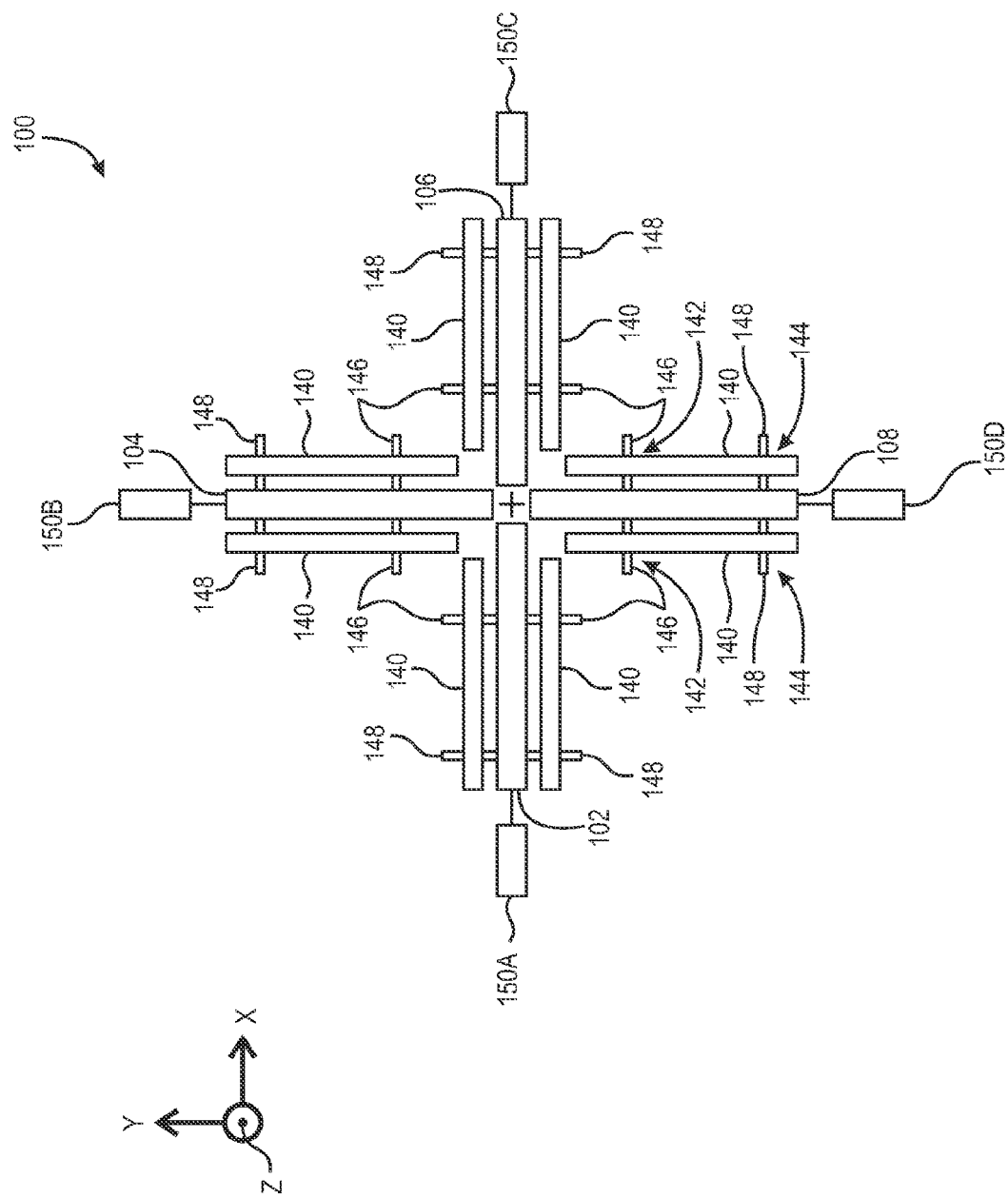

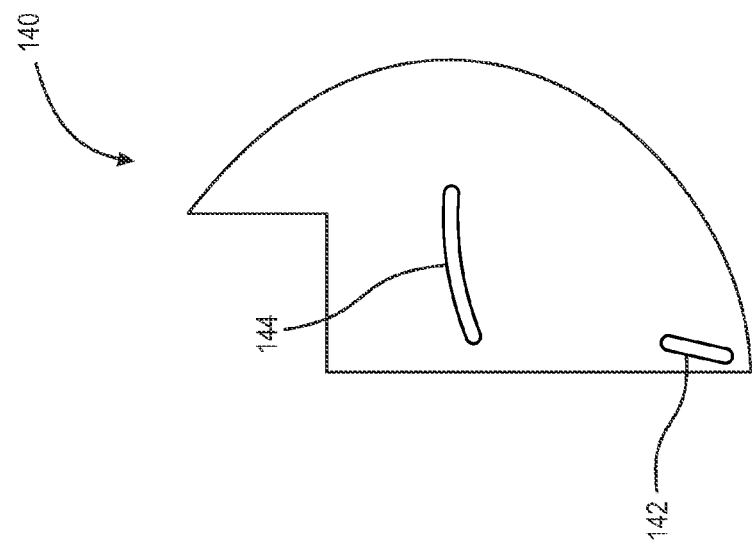
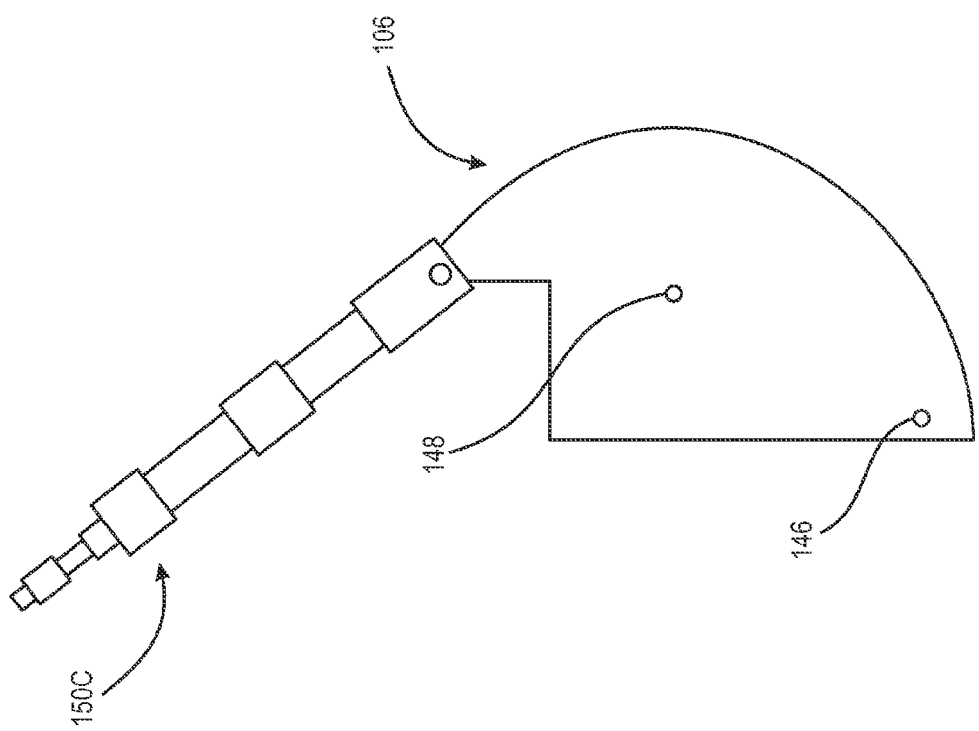

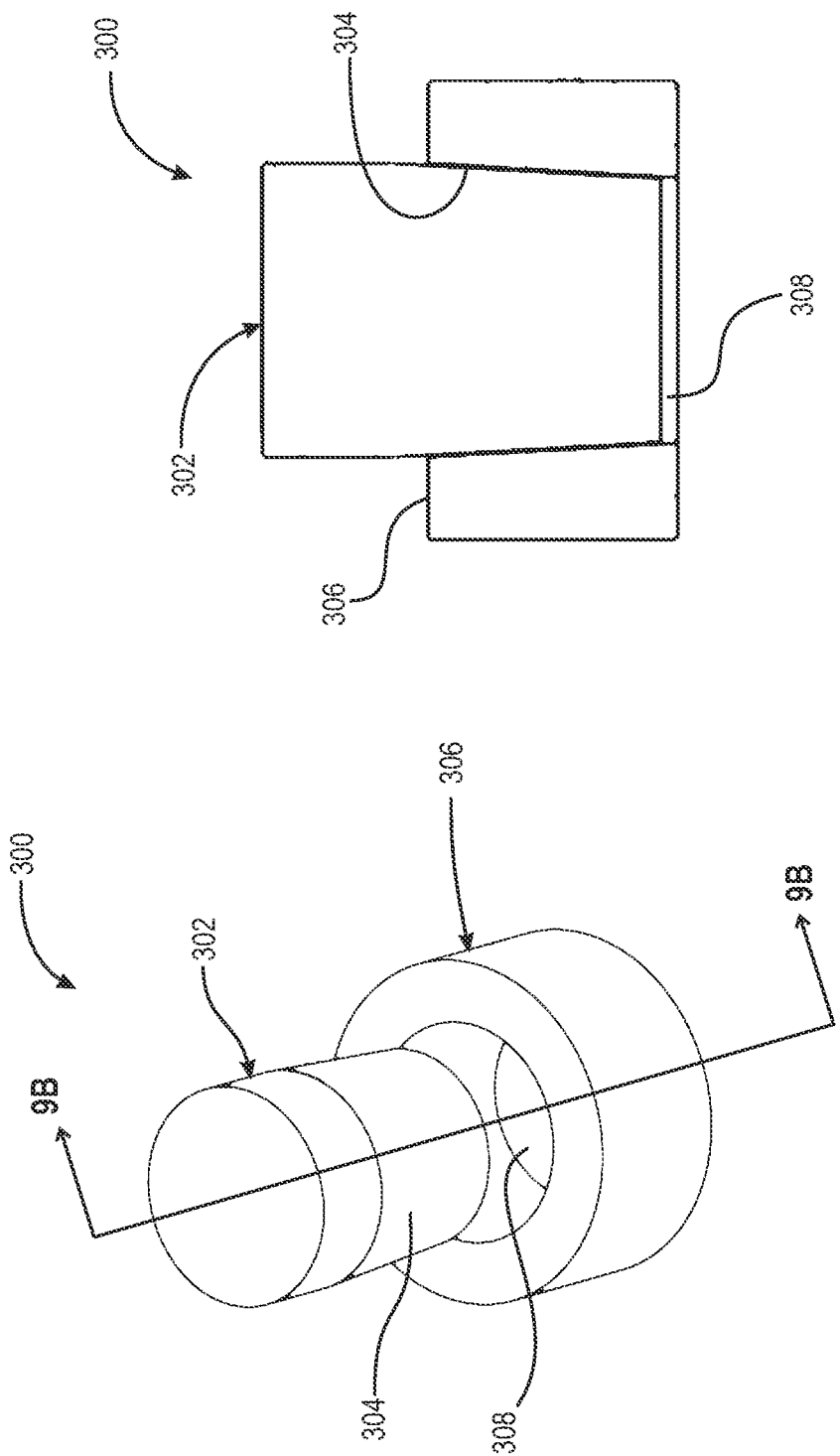

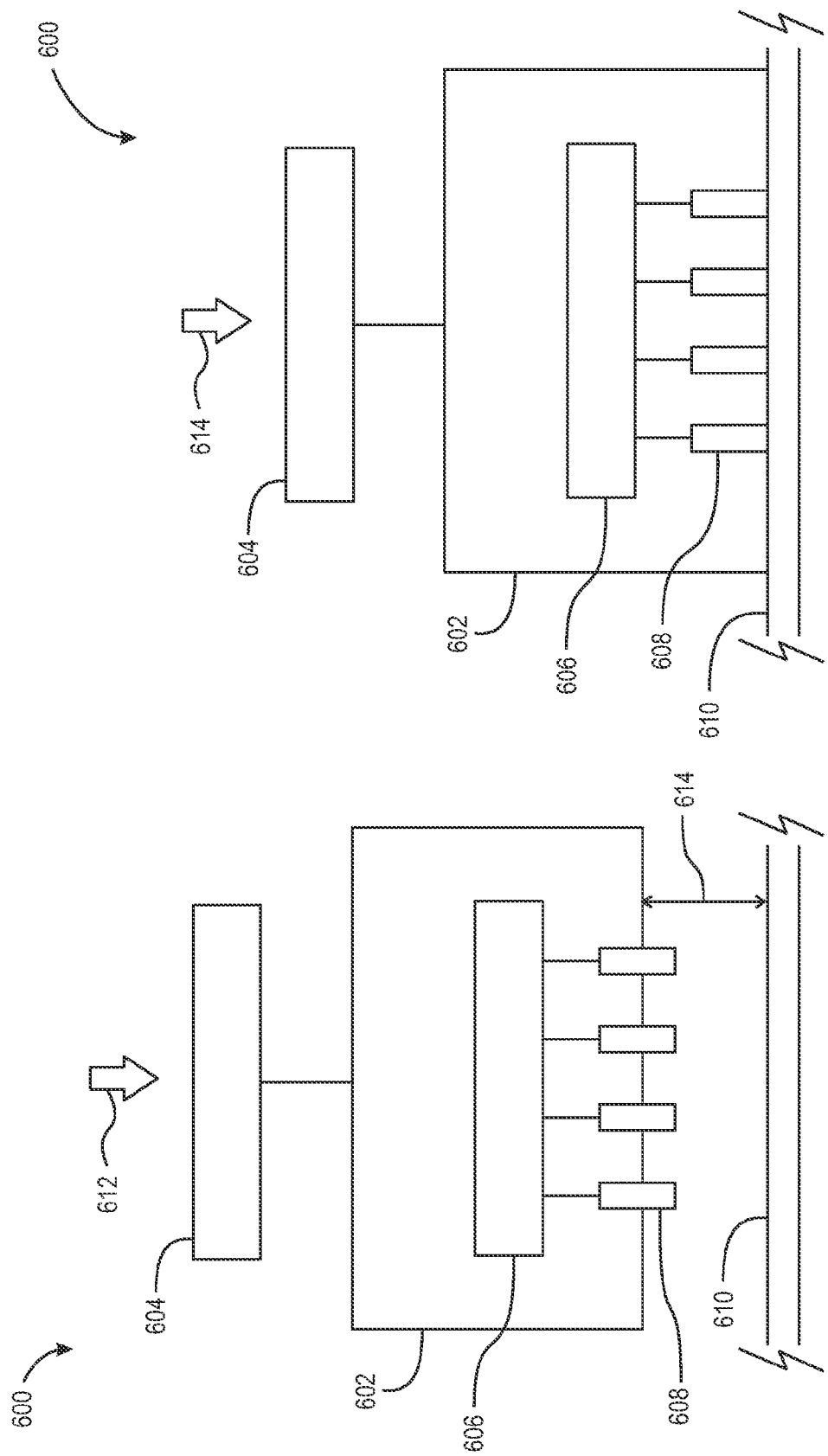

VARIABLE SPACING FOUR-POINT PROBE PIN DEVICE AND METHOD

CROSS-REFERENCE TO RELATED APPLICATIONS

This application claims the benefit under 35 U.S.C. §119 (e) of U.S. Provisional Patent Application No. 61/644,009, filed May 8, 2012, which application is incorporated herein by reference.

TECHNICAL FIELD

The present disclosure relates to a multi-point probe pin device with continuous variable spacing, in particular, a four-point probe pin device with wedge shaped probe pins that are pivoted to provide the continuous variable spacing.

BACKGROUND

Four-point probe pin devices are used to measure sheet resistance for conductive layers, for example, in semiconductor applications. There are presently two general design types for multi-pin probe devices used to measure sheet resistance. The first design uses large robust probes, and the second design uses smaller less robust pins. The pins for the first design type are durable and may last for extended periods of time; however, the large size of the pins (which provide the robustness of the design) limits the minimum spacing between points measurable using this design. The second design enables the measurement of points that are closer together; however, the probes are fragile and need to be replaced after approximately 100-1000 sample contacts. Further, known device are limited to a limited number of discrete pins spacings and configurations and measuring operations must be interrupted to switch between different spacings or configurations.

It is known to mount probe pin devices for measuring sheet resistance for conductive layers, for example, in semiconductor applications, on a probe holder with limited leveling mechanism. It is possible for the probe pin device to be tilted in the probe holder, which deleteriously impacts measurement operations and service time for the probe pin device. For example, surfaces of the probe pin device in contact with the probe holder are not well clamped by the probe holder for at some of the following reasons: physical aspects, such as roundness, of the probe holder are out of spec; a clamping force varies from time to time; and only a portion of the applicable surface of the probe pin device is attached to or in contact with the probe holder.

SUMMARY

According to aspects illustrated herein, there is provided a continuous variable spacing probe pin device, including first and second probe pins. The first and second probe pins are configured to measure a property of a conductive layer. In a first configuration, the first and second probe pins include respective first portions arranged to contact the conductive layer to measure the property. In a second configuration, the first and second probe pins include respective second portions arranged to contact the conductive layer to measure the property. A first area for each respective first portion is different from a second area for each respective second portion.

According to aspects illustrated herein, there is provided a continuous variable spacing probe pin device, including: a first probe pin including a first outer surface; a second probe pin including a second outer surface; and an actuator. The first and second probe pins are configured to measure a property of a conductive layer. The actuator is arranged to roll the first and second outer surfaces along the conductive layer, while maintaining contact of the first and second probe pins with the conductive layer, between first and second configurations. In the first configuration, respective first portions of the first and second outer surfaces in contact with the conductive layer are separated by a first distance. In the second configuration, respective second portions of the first and second outer surfaces in contact with the conductive layer are separated by a second distance different from the first distance.

According to aspects illustrated herein, there is provided a method of measuring a property of a conductive layer using a continuous variable spacing probe pin device including a first probe pin and a second probe pin configured to measure the property, the method including: contacting the conductive layer with the first and second probe pins such that first respective equal areas of the first and second probes are in contact with the conductive layer; and rolling the first and second probes along the conductive layer such that second respective equal areas of the first and second probes are in contact with the conductive layer. The first respective equal areas are different from the second respective equal areas.

According to aspects illustrated herein, there is provided a method of measuring a property of a conductive layer using a continuous variable spacing probe pin device including a first probe pin including a first outer surface, a second probe pin including a second outer surface, and an actuator, the first and second probe pins configured to measure the property, the method including: rolling, using the actuator, the first and second outer surfaces along the conductive layer, while maintaining contact of the first and second probe pins with the conductive layer, between first and second configurations; in the first configuration, contacting respective first portions of the first and second outer surfaces, separated by a first distance, with the conductive layer; and in the second configuration, contacting respective second portions of the first and second outer surfaces, separated by a second distance different from the first distance, in contact with the conductive layer.

According to aspects illustrated herein, there is provided a probe pin device assembly, including: a probe pin device including a plurality of probe pins at least partially disposed in the probe pin device and configured to measure a property of a conductive layer; and at least one actuator arranged to apply a respective variable force to each probe pin in the plurality of probe pins to contact and penetrate the conductive layer.

According to aspects illustrated herein, there is provided a method of operating a probe pin device assembly including a probe pin device and a plurality of probe pins at least partially disposed in the probe pin device and configured to measure a property of a conductive layer, a first actuator, and at least one second actuator, the method including: displacing, using the first actuator, the probe pin device toward the conductive layer; bringing the probe pin device to rest or contacting the conductive layer with the probe pin device; and displacing, using the at least one second actuator, the plurality of pins to contact the conductive layer.

According to aspects illustrated herein, there is provided a method of operating a probe pin device assembly including a probe pin device with at least one proximity sensor, a plurality of probe pins at least partially disposed in the probe pin device and configured to measure a property of a conductive layer, and an actuator, the method including: displacing, using the actuator, the probe pin device toward the conductive layer; measuring, using the proximity sensor, a position of the probe pin device with respect to the conductive layer; and modifying the displacement of the probe pin device toward the conductive layer according to the measured position.

According to aspects illustrated herein, there is provided a probe pin device assembly, including: a probe pin device holder including an opening having a first surface; and a probe pin device including a plurality of probe pins configured to measure a property of a conductive layer and a second surface. The probe pin holder is arranged for installation in the opening of the probe pin device holder such that the first and second surfaces are in contact. The first and second surfaces have respective mating complimentary shapes arranged to stabilize and align the probe pin device with respect to the probe pin device holder. The respective mating complimentary shapes are selected from the group consisting of first and second flat surfaces; first and second conically shaped surfaces; and a groove and a protrusion.

These and other objects and advantages of the present disclosure will be readily appreciable from the following description of the invention and from the accompanying drawings and claims.

BRIEF DESCRIPTION OF THE DRAWINGS

Various embodiments are disclosed, by way of example only, with reference to the accompanying schematic drawings in which corresponding reference symbols indicate corresponding parts, in which:

FIG. 8A is a schematic top view of a probe pin assembly for a four-point probe pin device with an actuator;

FIG. 8B is a schematic side view of one probe pin from FIG. 8A;

FIG. 8C is a schematic side view of a support plate from FIG. 8A;

FIG. 10A is a schematic perspective view of a probe pin device assembly;

FIG. 10B is a schematic cross-sectional view generally along line 10B-10B in FIG. 10A;

FIGS. 13A and 14B are respective block diagrams of a probe pin device assembly;

DETAILED DESCRIPTION

At the outset, it should be appreciated that like drawing numbers on different drawing views identify identical, or functionally similar, structural elements of the disclosure. It is to be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure.

Figure 1:
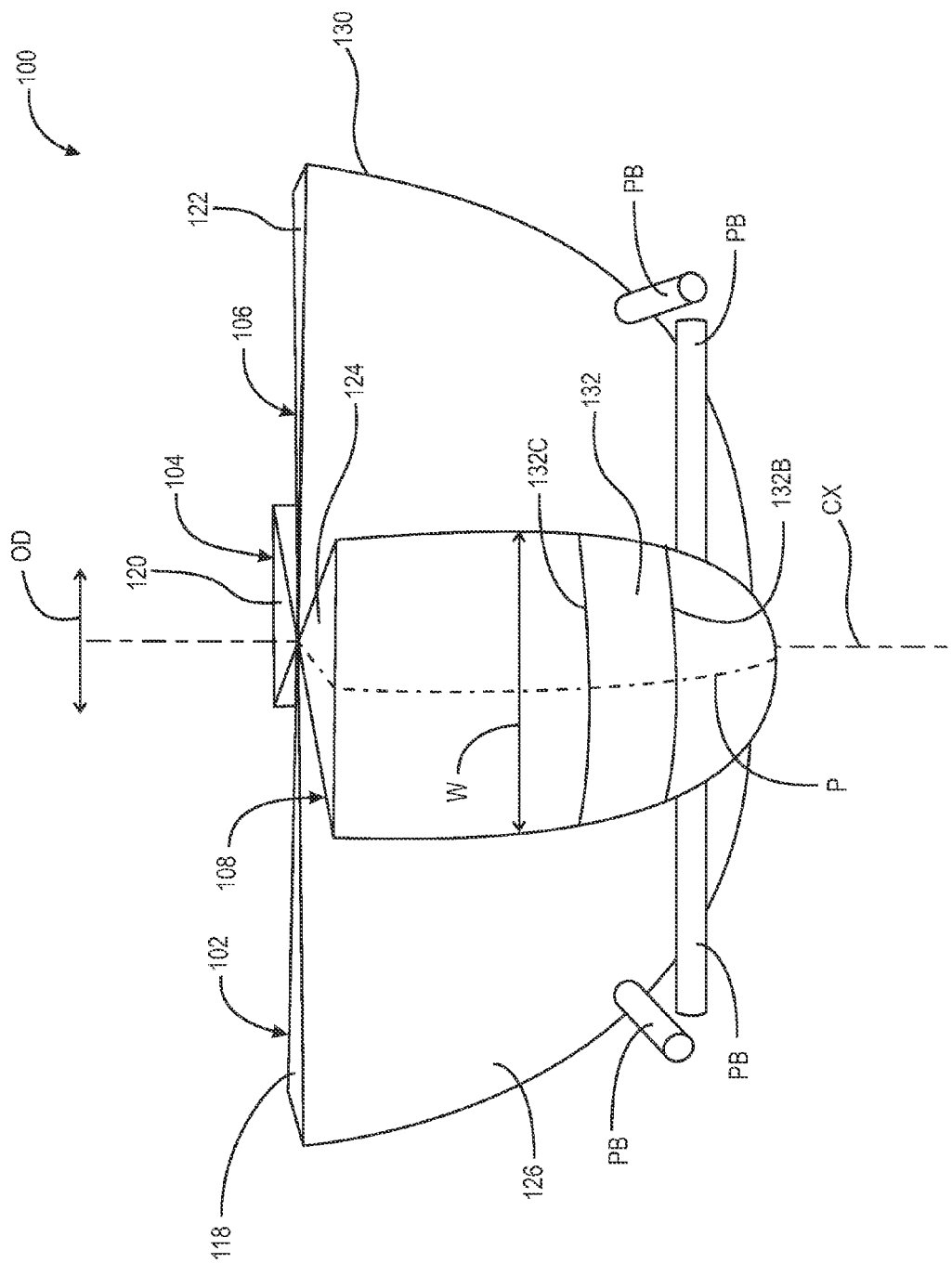
FIG. 1 is a schematic perspective side view of a probe pin assembly, with variable spacing, for a four-point probe pin device.

FIG. 1 is a schematic perspective side view of probe pin assembly 100, with variable spacing, for a four-point probe pin device.

Figure 2:
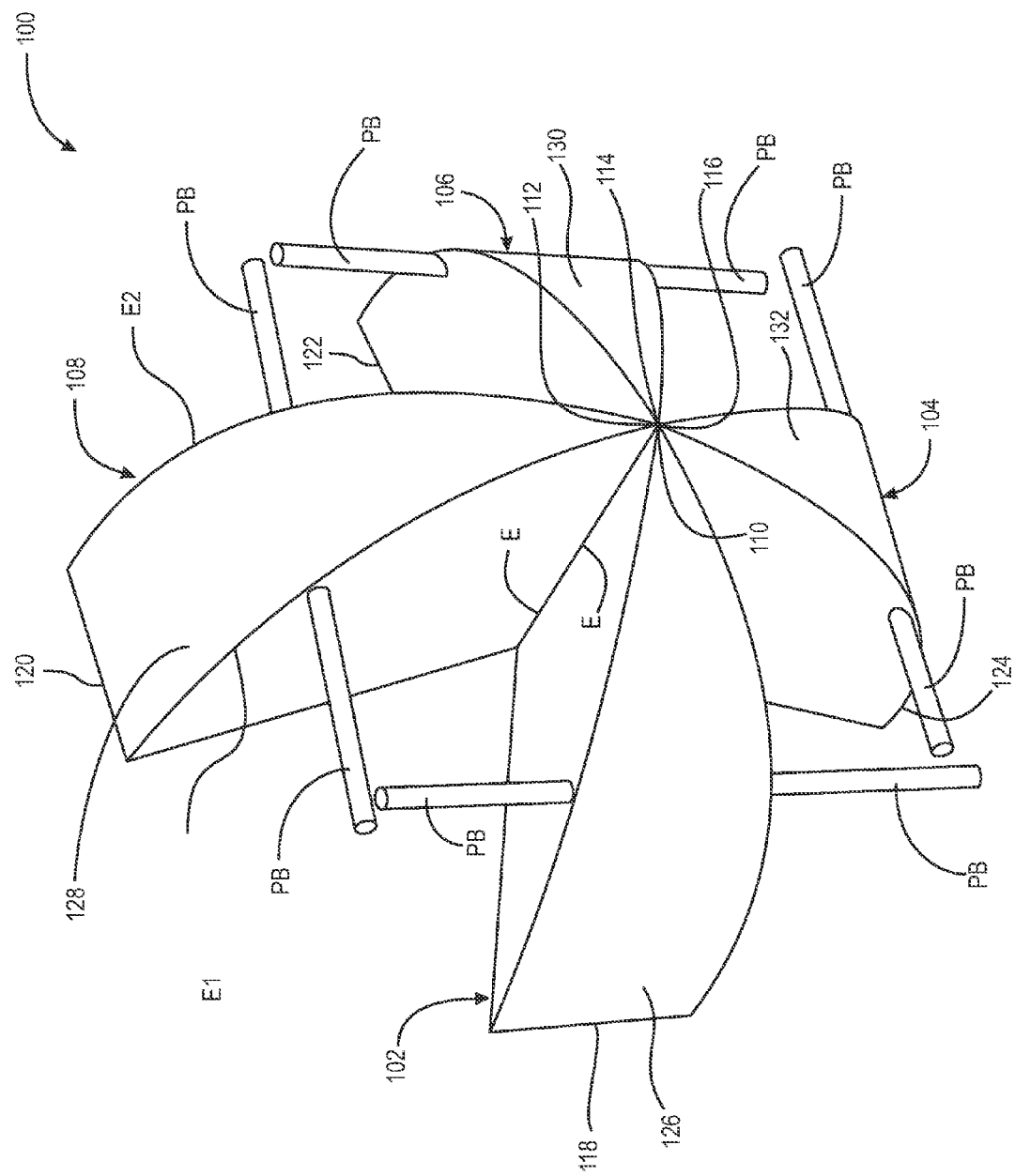
FIG. 2 is a schematic perspective bottom view of the probe pin assembly in FIG. 1.

FIG. 2 is a schematic perspective bottom view of probe pin assembly 100 in FIG. 1.

Figure 3:
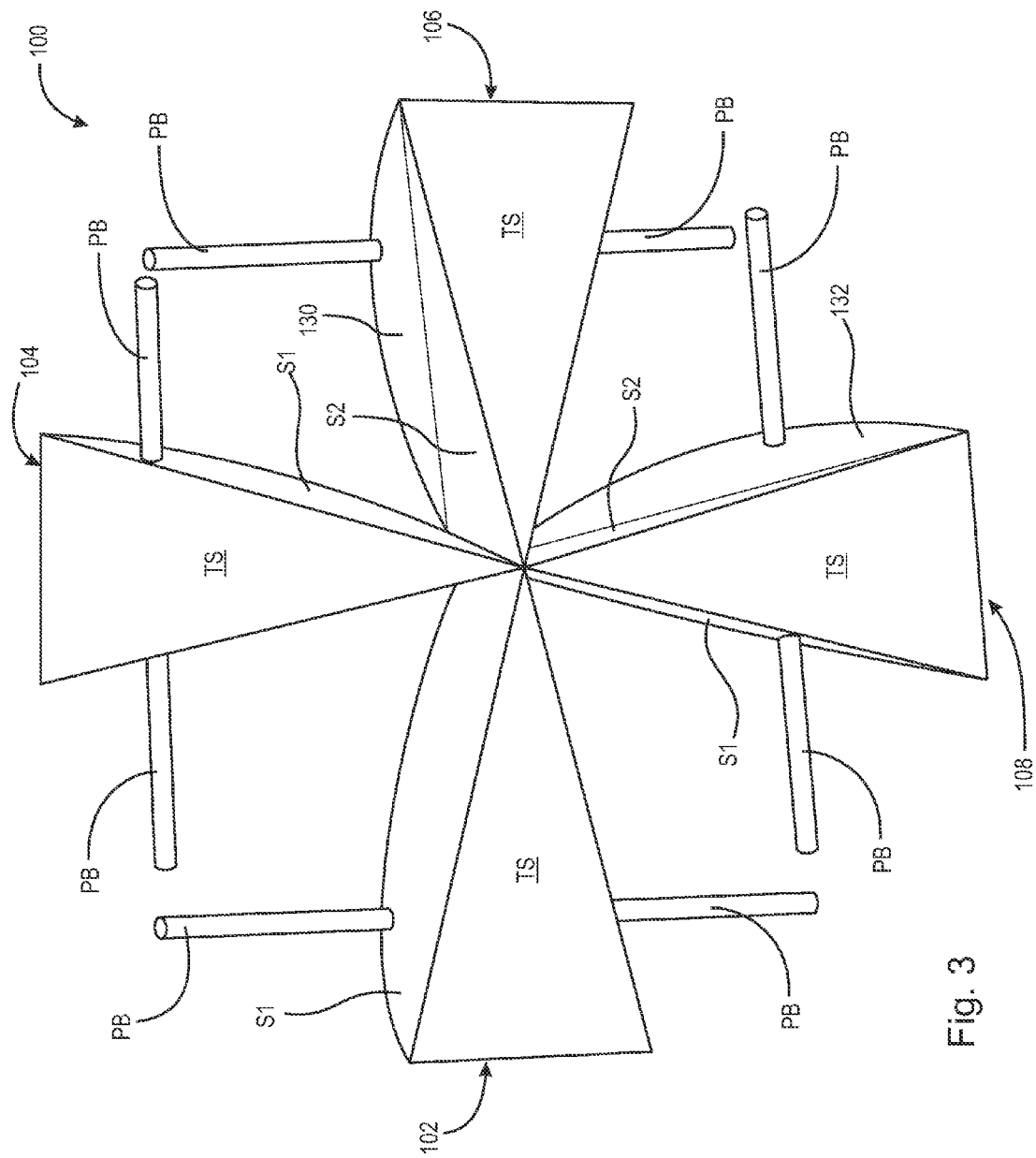
FIG. 3 is a schematic perspective top view of the probe pin assembly in FIG. 1.

FIG. 3 is a schematic perspective top view of probe pin assembly 100 in FIG. 1.

Figure 4:
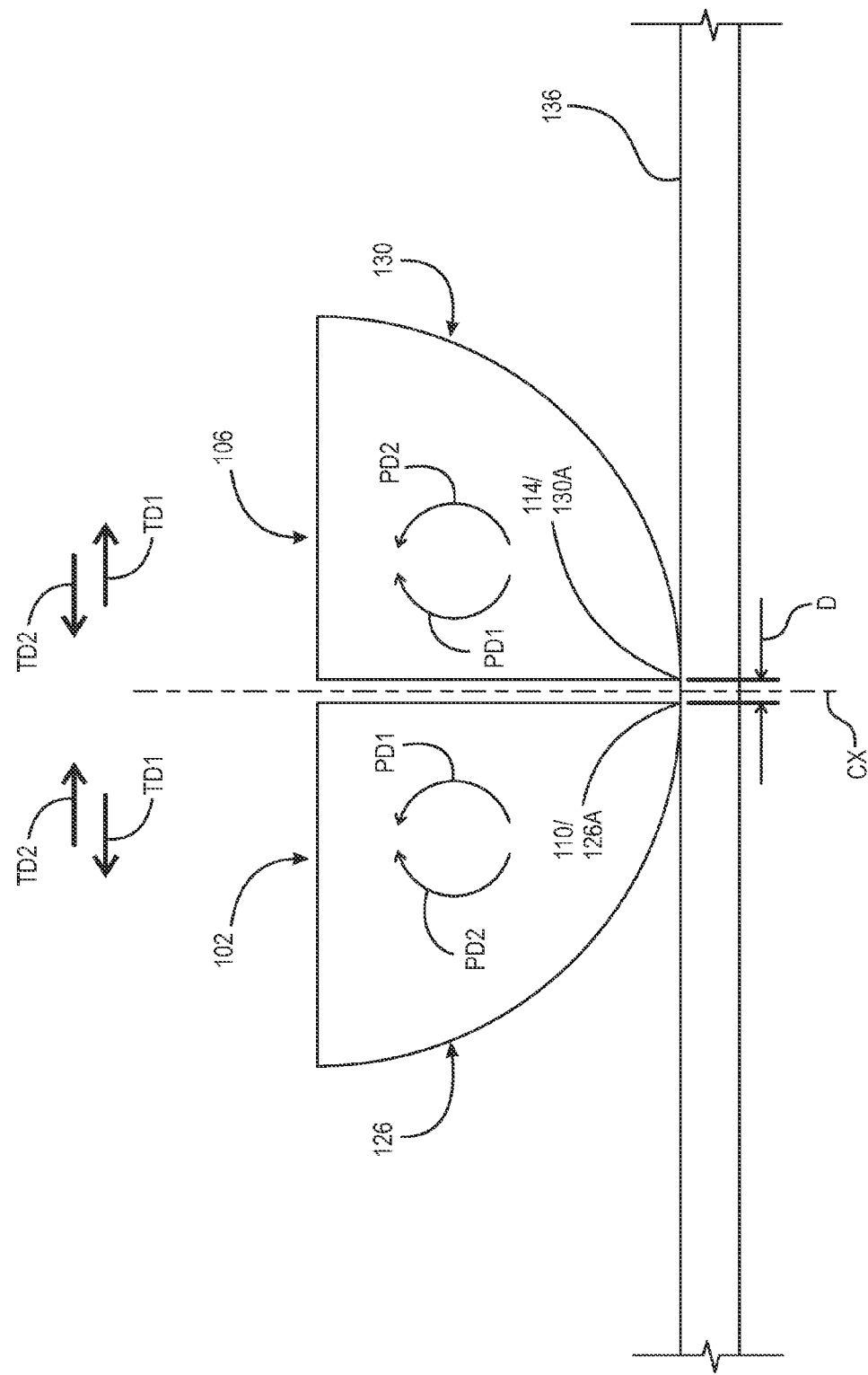
FIG. 4 is a schematic side view of a pair of probe pins from the probe pin assembly in FIG. 1 in a configuration with minimal spacing.

FIG. 4 is a schematic side view of a pair of probe pins from probe pin assembly 100 in FIG. 1 in a configuration with minimal spacing.

Figure 5:
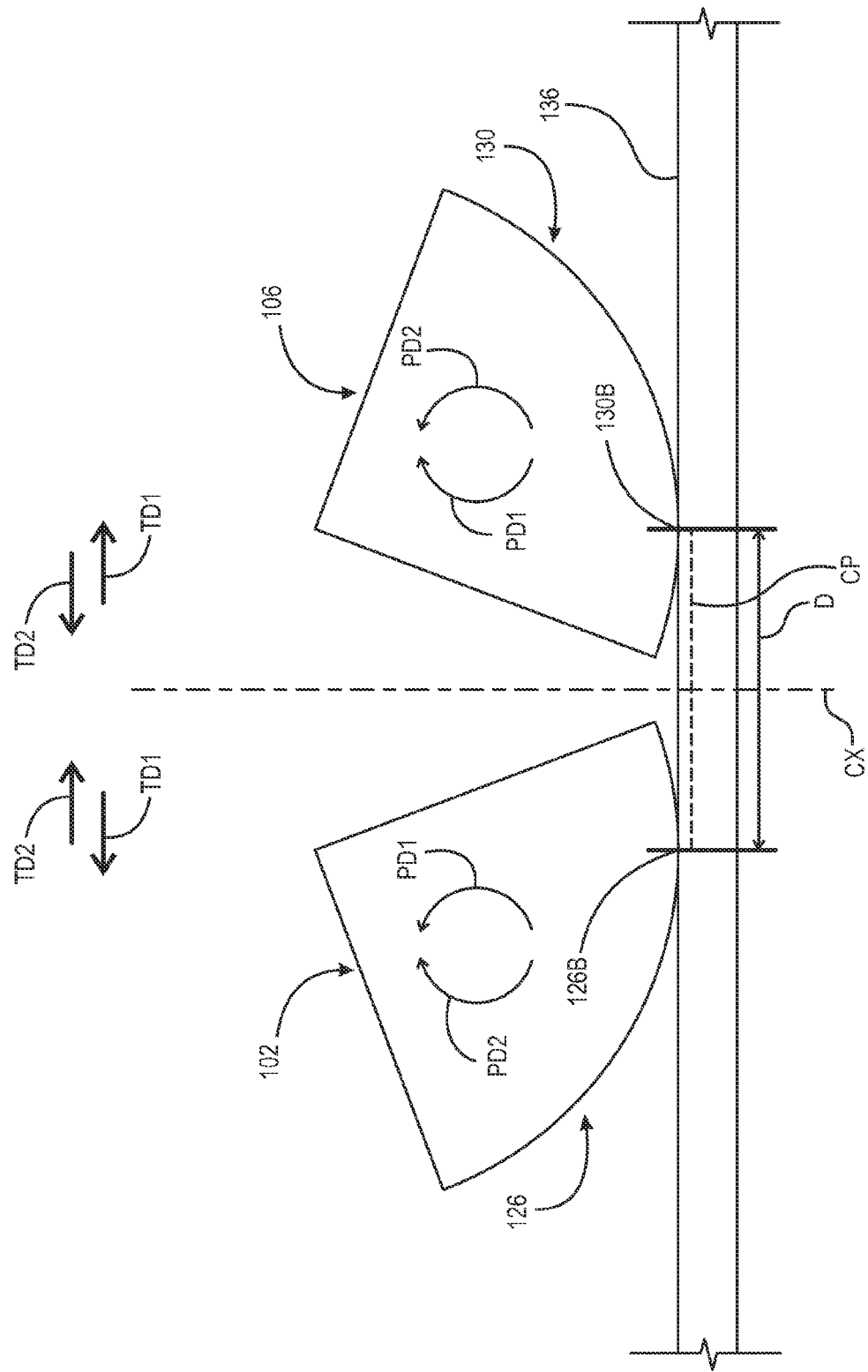
FIG. 5 is a schematic side view of the pair of probe pins in FIG. 4 with increased spacing.

FIG. 5 is a schematic side view of the pair of probe pins in FIG. 4 with increased spacing.

Figure 6:
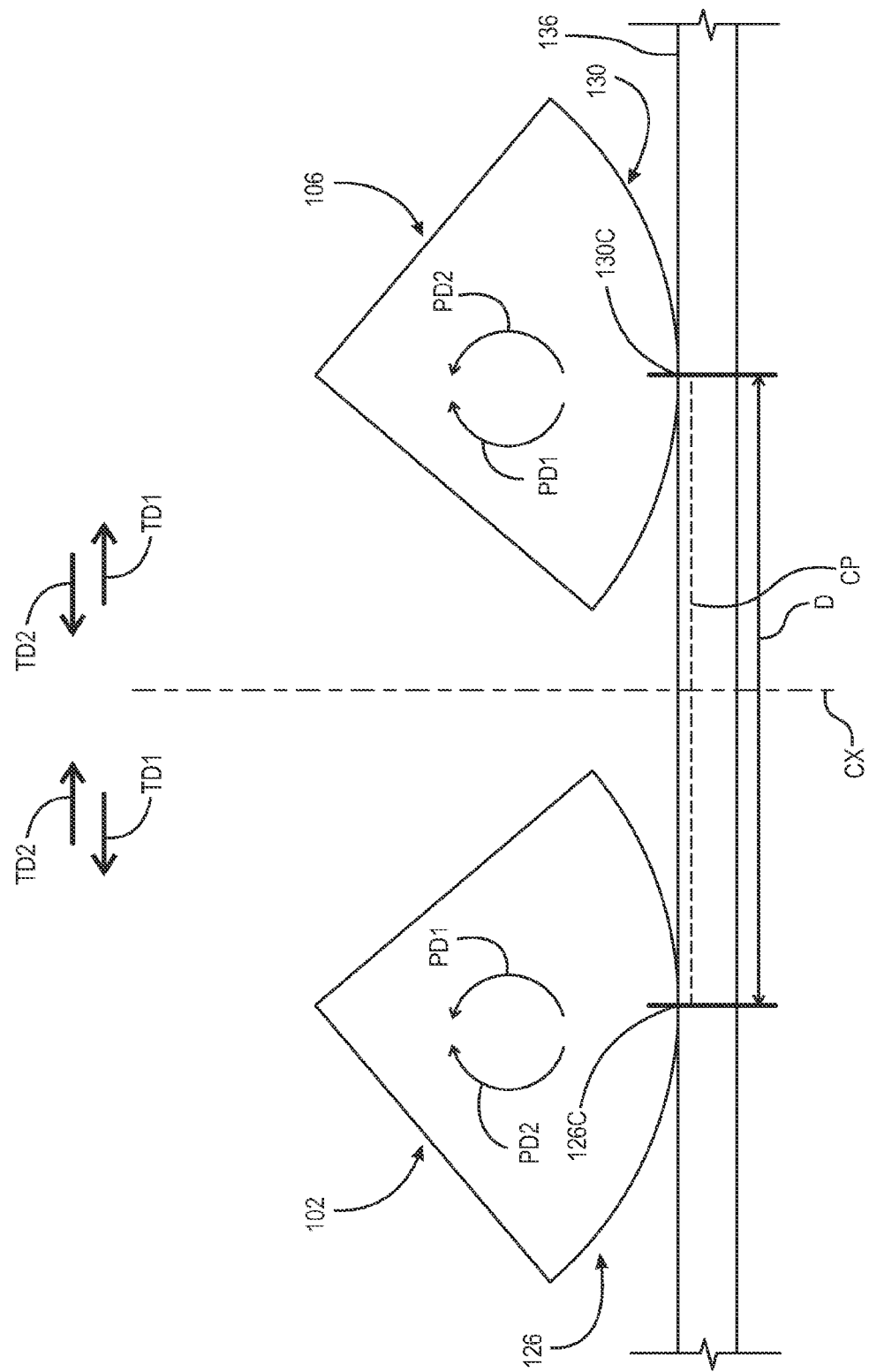
FIG. 6 is a schematic side view of the pair of probe pins in FIG. 5 with increased spacing.

FIG. 6 is a schematic side view of the pair of probe pins in FIG. 5 with increased spacing.

Figure 7:
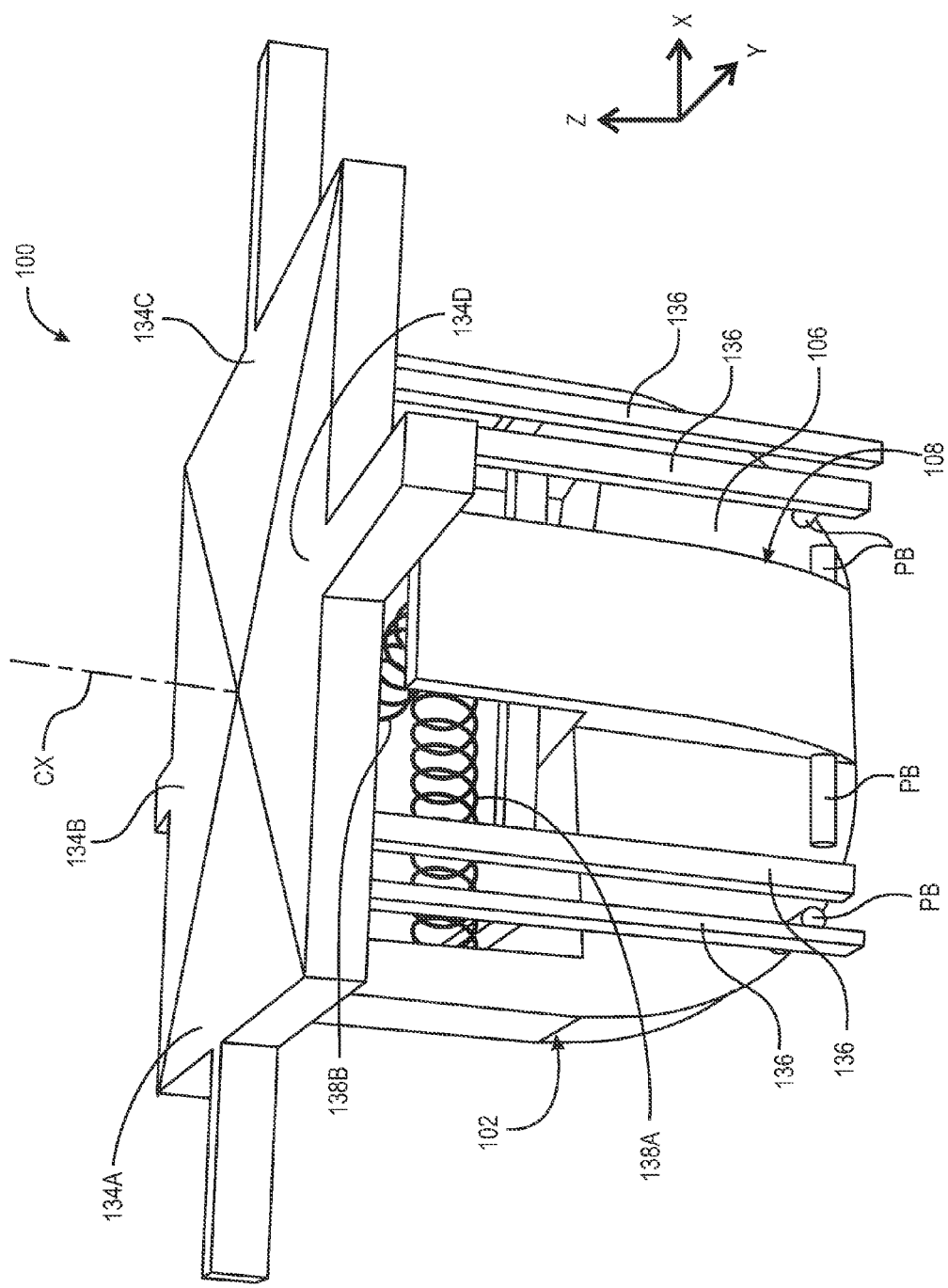
FIG. 7 is a schematic perspective view of the probe pin assembly in FIG. 1 with an actuator.

FIG. 7 is a schematic perspective side view of probe pin assembly 100 in FIG. 1 with an actuator. The following should be viewed in light of FIGS. 1 through 7. Assembly 100 is part of a larger probe pin device; however, to clarify the presentation, the housing and other ancillary parts of the larger device are not shown in the figures except as noted. Assembly 100 includes central axis CX and probe pins 102, 104, 106, and 108. Pins 102, 104, 106, and 108 include contact points 110, 112, 114, and 116, respectively, ends 118, 120, 122, and 124, respectively, and outer surfaces 126, 128, 130, and 132, respectively. Surfaces 126, 128, 130, and 132 connect 110, 112, 114, and 116, respectively, with ends 118, 120, 122, and 124, respectively. Pins 102 and 106 are diametrically disposed with respect to central axis CX and pins 104 and 108 are diametrically disposed with respect to axis CX. In an example embodiment, pins 102/106 are orthogonally disposed with respect to pins 104/108. In an example embodiment, assembly 100 includes actuator 134. Pins 102, 104, 106, and 108 are configured to measure a property of conductive layer 136.

The following discussion is directed to one pair of pins for device 100, for example, pins 102 and 106; however, it should be understood that the discussion is applicable to both pairs of pins. In a first configuration, for example, as shown in FIG. 5, respective portions 126A and 130A of outer surfaces 126 and 130, respectively, are arranged to contact the conductive layer. In a second configuration, for example as shown in FIG. 4, the actuator is arranged to roll (pivot and translate) pins 102 and 106 such that portions 126B and 130B, of outer surfaces 126 and 130, respectively, contact the conductive layer. Actuator 134 is arranged to pivot and translate pins 102, 104, 106, and 108 such that pins 102, 104, 106, and 108 roll along layer 136 to transition between different configurations, for example, the first and second configurations noted above. Pins 102 and 106, for example, outer surfaces 126 and 130, remain in continuous contact with layer 136 during the transition.

Each of portions 126A and 130A includes an area of outer surfaces 126 and 130, respectively, in contact with the conductive layer, and each of portions 126B and 130B includes an area of outer surfaces 126 and 130, respectively, in contact with the conductive layer. In an example embodiment, the areas of contact for the first configuration of pins 102 and 106 are different from the areas of contact for the second configuration of pins 102 and 106. For example, the areas of contact for portions 126A and 130A (contact points 110 and 114, respectively) are the minimal areas of contact possible with pins 102 and 106, and are less than the areas of contact for portions 126B and 130B. In an example embodiment, rolling pins 102, 104, 106, and 108 along layer 136 changes the respective areas of the pins in contact with the conductive layer.

As shown in the transition from the configuration of FIG. 4 to FIG. 5 or from FIG. 5 to FIG. 6, as pins 102 and 106 are pivoted and translated in pivoting direction PD1 and translation direction TD1, the areas of contact for pins 102 and 106 increase. As shown in the transition from the configuration of FIG. 6 to FIG. 5 or from FIG. 5 to FIG. 4, as pins 102 and 106 are pivoted and translated in pivoting direction PD2 and translation direction TD2, opposite directions PD1 and TD1, respectively, the areas of contact for pins 102 and 106 decrease. For example, as shown in FIG. 4, the areas of contact for portions 128C and 130C, of outer surfaces 126 and 130, respectively, are less than the areas of contact for that portions 126B and 130B, of outer surfaces 126 and 130, respectively.

As pins 102 and 106 are pivoted and translated in pivoting direction PD1 and translation direction TD1, distance D between areas of contact for the pins increases. As pins 102 and 106 are pivoted and translated in pivoting direction PD2 and translation direction TD2, distance D between areas of contact for the pins decreases. In an example embodiment, pins 102, 104, 106, and 108 are displaced in unison. For example, the movement of pins 102 and 106 is mirrored by the movement of pins 104 and 108. For example, respective distances D in FIGS. 4, 5, and 6 between areas of contact for pins 102 and 106 are also the respective distances between areas of contact for pins 104 and 108. Thus, a square pattern of pins 102, 104, 106, and 108 is always maintained.

The configuration of pins 102 and 106 results in the variable areas of contact and variable distance D noted above. In an example embodiment, each of outer surfaces 126, 128, 130, and 132 is curved between the respective contact point and end for the respective pin including the outer surface. Surfaces 126 and 130, between edges E1 and E2, can be flat or curved. In an example embodiment, each of outer surfaces 126, 128, 130, and 132 forms a portion of a respective spherical surface.

In an example embodiment, the central axis is parallel to and included in plane P passing through contact points 110 and 114 and ends 118 and 122. In an example embodiment, width W of outer surfaces 126 and 130 progressively increases, in direction OD orthogonal to the plane, moving from the contact points to the ends. Thus, as surfaces 126 and 130 are rolled along the conductive layer from the contact points toward the ends, due to the increase in W, the area of contact with the conductive layer increases. It is clear that as surfaces 126 and 130 are rolled along the conductive layer from the end toward the contact points, due to the decrease in W, the area of contact with the conductive layer decreases. Portions 132B and 132C in FIG. 1 are substantially analogous to portions 126B and 130B and 126C and 130C, respectively, and illustrate the differences in the areas of contact described above.

In an example embodiment, each of pins 102, 104, 106, and 108 includes top surface TS, inner edge E, and side surfaces S1 and S2. Surface TS is continuous with the outer surface of the pin including surface TS and with respective side surfaces S1 and S2. Edge E connects TS and the contact point for the pin including edge E. In an example embodiment, surface TS tapers inwardly from the respective outer surface to the respective edge E.

In an example embodiment, assembly 100 includes control plates 134A-D, pivot rods 136 connected to the control plates and push rods PB, and springs 138A and 138B. Springs 138A urge pins 102 and 106 toward axis CX and springs 138B urge pins 104 and 108 toward axis CX. Respective actuators (not shown) are connected to each control plate. To increase distance D, the actuators displace the control plates in a combined X and Z direction or a combined Y and Z direction, that is, within the framework of each pin, the respective control plate is pushed down and away from axis CX. For example, plate 134A is pushed in a negative X and a negative Z direction. To decrease distance D, the actuators can be controllably deactivated to enable the springs to draw the pins toward axis CX or the actuators can actively displace the pins, for example, displace plate 134A in positive X and Z directions.

FIG. 8A is a schematic top view of probe pin assembly 100 with an actuator.

FIG. 8B is a schematic side view of one probe pin from FIG. 8A.

FIG. 8C is a schematic side view of a support plate from FIG. 8A. In an example embodiment, as shown in FIGS. 8A through 8C, width W of pins 102, 104, 106, and 108 is uniform from the respective contact point to the respective ends. The description of assembly 100 for FIGS. 1 through 7 is otherwise applicable to the embodiment with uniform W. For example, as pins 102, 104, 106, and 108 are rolled across layer 136, distance D between areas of contact for pins 102 and 106 and distance D between areas of contact for pins 104 and 108 remain equal. In an example embodiment, assembly 100 includes support plates 140 with slots 142 and 144. Pins 102, 104, 106, and 108 include respective pins 146 and 148 engaged with respective slots 142 and 144. Device 100 also includes actuators 150A-D connected to respective pins 102, 104, 106, and 108, respectively. Any actuator known in the art can be used. To increase distance D, the actuators urge the respective pins down and away from axis CX. For example, actuator 150A provides a force in a negative X and Z direction and actuator 150B provides a force in a positive Y and negative Z direction. To decrease distance D, the forces described above are reversed. The displacement of pins 146 and 148 through the respective configurations of slots 142 and 144 forces the pins to pivot and translate as described above.

The following should be viewed in light of FIGS. 1 through 8C. The following describes a method for measuring a property of a conductive layer using a continuous variable spacing probe pin device including a first probe pin and a second probe pin configured to measure the property. A first step contacts the conductive layer with the first and second probe pins such that first respective equal areas of the first and second probes are in contact with the conductive layer. A second step rolls the first and second probes along the conductive layer such that second respective equal areas of the first and second probes are in contact with the conductive layer. The first respective equal areas are different from the second respective equal areas.

In an example embodiment, rolling the first and second probe pins along the conductive layer includes maintaining contact between the first and second probe pins and the conductive layer. In an example embodiment, rolling the first and second probe pins along the conductive layer includes equally varying respective areas of contact between the first and second outer surfaces and the conductive, or maintaining equal respective areas of contact between the first and second outer surfaces.

In an example embodiment, the first and second probe pins are diametrically opposed to each other with respect to a central axis and a third step contacts the conductive layer with the third and fourth probe pins such that third respective equal areas of the third and fourth probes are in contact with the conductive layer, and the third and fourth probe pins are diametrically opposed to each other with respect to the central axis. In an example embodiment, a fourth step rolls the third and fourth probes along the conductive layer such that fourth respective equal areas of the third and fourth probes are in contact with the conductive layer, and the third respective equal areas are different from the fourth respective equal areas.

The following should be viewed in light of FIGS. 1 through 8C. The following describes a method for measuring a property of a conductive layer using a continuous variable spacing probe pin device including a first probe pin including a first outer surface, a second probe pin including a second outer surface, and an actuator, the first and second probe pins configured to measure the property. A first step rolls, using the actuator, the first and second outer surfaces along the conductive layer, while maintaining contact of the first and second probe pins with the conductive layer, between first and second configurations. A second step contacts, in the first configuration, respective first portions of the first and second outer surfaces, separated by a first distance, with the conductive layer. A third step contacts, in the second configuration, respective second portions of the first and second outer surfaces, separated by a second distance different from the first distance, in contact with the conductive layer.

In an example embodiment, a fourth step rolls, using the actuator, third and fourth outer surface of third and fourth probe pins along the conductive layer, while maintaining contact of the third and fourth probe pins with the conductive layer, between the first and second configurations. A fifth step contacts, in the first configuration, respective third portions of the third and fourth outer surfaces, separated by the first distance, with the conductive layer. A sixth step contacts, in the second configuration, respective fourth portions of the third and fourth outer surfaces, separated by the second distance, in contact with the conductive layer.

In an example embodiment, rolling the first, second, third, and fourth outer surfaces along the conductive layer, while maintaining contact of the first, second, third, and fourth probe pins with the conductive layer includes maintaining a third distance between respective areas of contact between the first and second outer surfaces and the conductive layer equal to a fourth distance between respective areas of contact between the third and fourth outer surfaces and the conductive layer.

The following provides further detail regarding assembly 100. In an example embodiment (not shown), width W of an outside surface increases as described above from a contact point to an end; however, rather than progressively increasing all the way to the end, at some point between the contact point and the end, width W remains constant. Contact points can be made very sharp/fine to enable a minimal distance D between areas of contact for the pins. With proper insulation coatings on the pins, contact points can actually touch for a minimal distance D. Contact areas for pins 102, 104, 106, and 108 form a square pattern with a large range of values for D and for respective areas of contact. Although pins 102, 104, 106, and 108 are shown in a cross-pattern, it should be understood that other configurations are possible. In general, assembly 100 can be used in any four-pin configuration or measuring operation known in the art.

It is desirable to optimize measuring operations by reducing contact resistance, which is related to the area of contact between a probe pin and the conductive layer. Specifically, the contact area and the contact resistance have an inverse relationship. It also is desirable to place areas of contact for probe pins as close together as possible for certain measurements. Advantageously, embodiments of assembly 100 having a varying width W enable a minimal distance D by minimizing width W at the contact point. These embodiments also enable a reduction in contact resistance as width W increases from the contact point to the end.

Assembly 100 also enables continuous measurements as the configuration and spacing of the probe pins are varied, for example, as distance D varies. Thus, rather than having to interrupt measuring operations to change pin configuration and spacing, assembly 100 enables measurements to continue uninterrupted. Further, the continuous variable spacing of assembly 100 provides a nearly infinite range of configurations and spacing, in contrast to known probe pin devices, which are restricted to a limited number of fixed spacings as noted above.

Figure 9B:
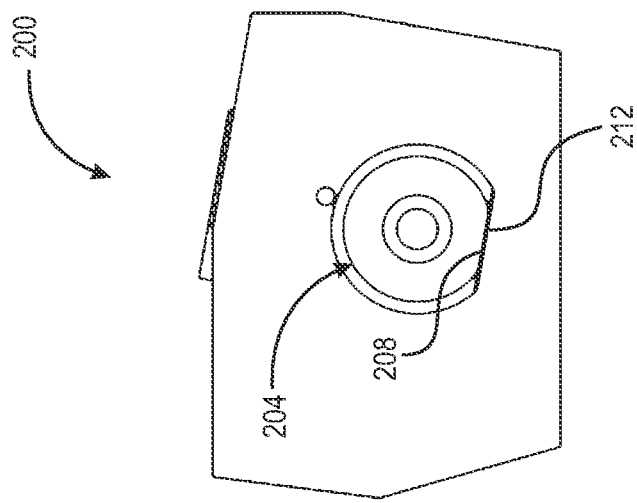
FIGS. 9A and 9B are schematic perspective and bottom views, respectively, of a probe pin device assembly.
Figure 9A:
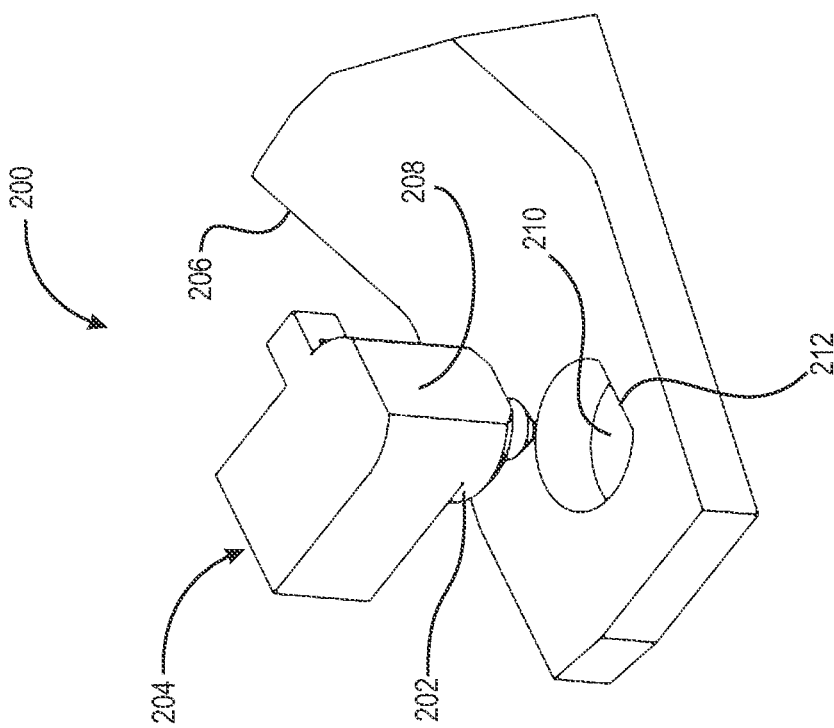

FIGS. 9A and 9B are schematic perspective and bottom views, respectively, of probe pin device assembly 200. For probe pin device assembly 200, a contact area between barrel 202 of probe pin device 204 and probe pin device holder 206 is well maintained and improves the leveling rigidity for device 204. For example, barrel 202 includes flat surface 208 and receiving opening 210 of probe pin device holder 200 includes matching/complimentary flat surface 212. The contact of surfaces 208 and 212 enables a well controlled rigid alignment of probe pin device 204 with tight mechanical tolerance.

FIG. 10A is a schematic perspective view of probe pin device assembly 300.

FIG. 10B is a schematic cross-sectional view generally along line 10B-10B in FIG. 10A. Probe pin device assembly 300 includes probe pin device 302 with conical barrel 304 and probe pin device holder 306. Opening 308 in holder 306 has a matching/complementary conical shape. The conical shape advantageously enables easy manufacturing with well controlled surface quality.

Figure 11B:
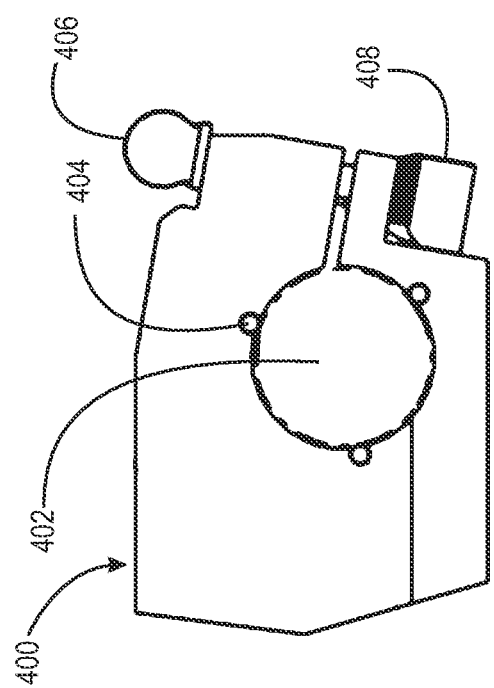
FIGS. 11A and 11B are schematic perspective and side views, respectively, of a probe pin device holder.
Figure 11A:
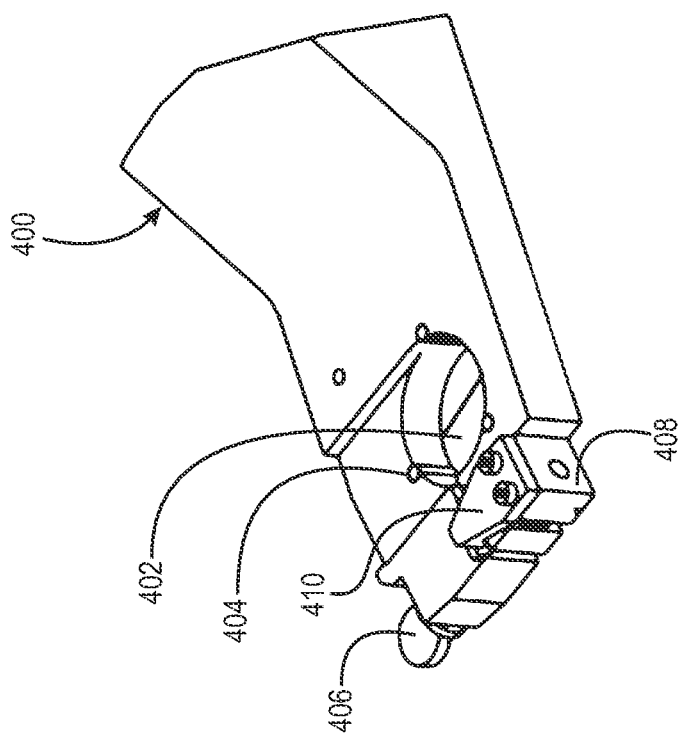

FIGS. 11A and 11B are schematic perspective and side views, respectively, of probe pin device holder 400. Probe pin device holder 400 includes opening 402 for receiving a probe pine device, and a plurality of, for example three, vertical guide pin grooves 404 on a circumference of opening 402. Contact between the probe pin device and probe pin holder 400 is between pins on a barrel of the probe pin inserted in grooves 404. Clamp screw 406 is used to lock the probe pin device in holder 400. Clamp screw 406 is fixed on probe holder 400 by lock screw 408. To fix the clamping force, hard stopper 410 is provided on the probe holder.

Figure 12:
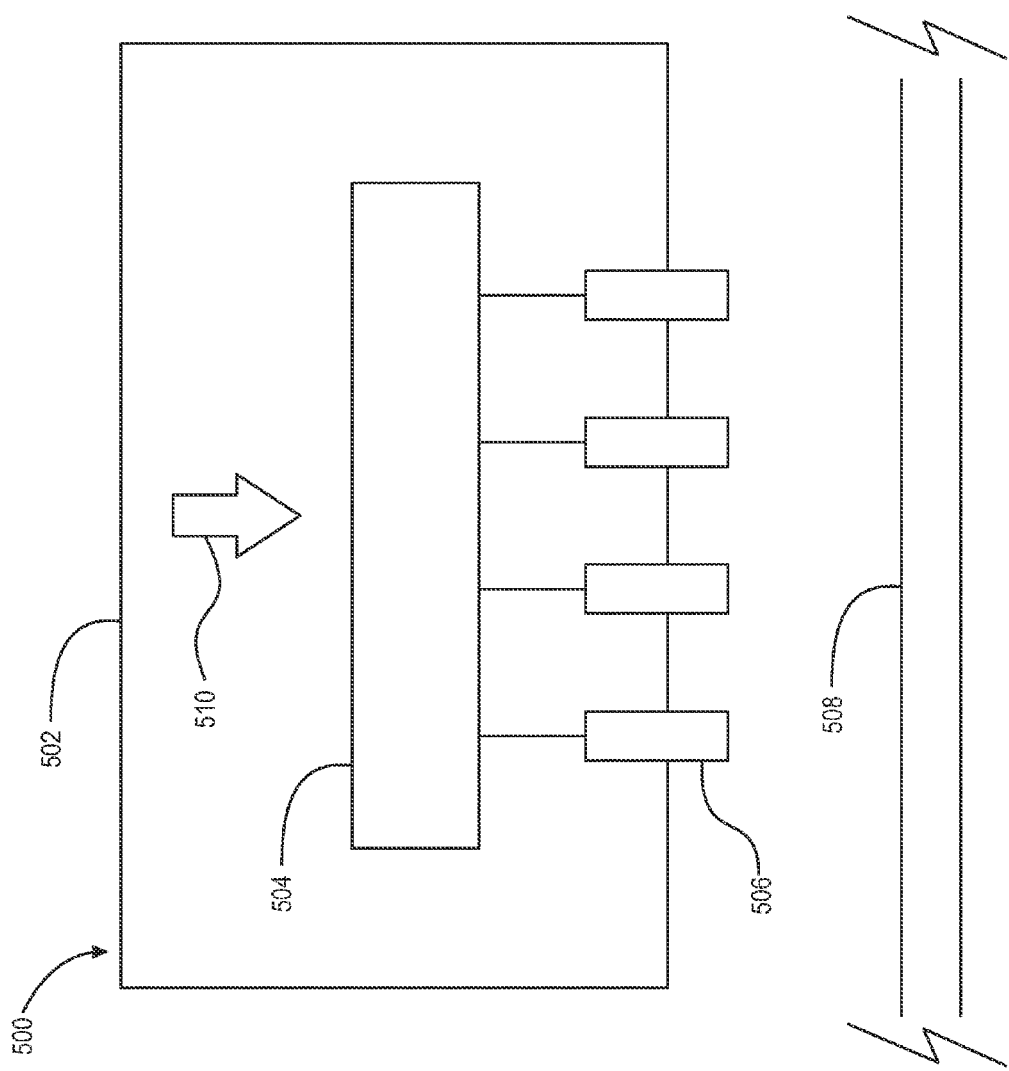
FIG. 12 is a block diagram of a probe pin device assembly with individual probe pin control.

FIG. 12 is a block diagram of probe pin device assembly 500 with individual probe pin control. Assembly 500 includes probe pin device 502 and at least one actuator 504. Device 502 includes probe pins 506 at least partially disposed in device 502 and configured to measure a property of conductive layer 508. The at least one actuator is arranged to apply a respective variable force, for example, in direction 510, to each probe pin 506 to contact and penetrate the conductive layer. Any probe pin device, probe pin, or actuator known in the art can be used. Thus, actuator or actuators 504 provide a separate and variable force to each pin.

FIGS. 13A and 13B are respective block diagrams of probe pin device assembly 600. Assembly 600 includes probe pin device 602, actuator 604, and at least one actuator 606. Device 602 includes probe pins 608 at least partially disposed in device 602 and configured to measure a property of conductive layer 610. As shown in FIG. 12A, actuator 604 is configured to displace device 602 in direction 612 toward layer 610. When device 602 is within a specified distance 614 of layer 610, actuator 604 stops displacing device 602. When device 602 comes to a complete stop, for example, device 602 ceases to oscillate, actuator or actuators 606 displace pins 608 to contact and penetrate layer 610.

As shown in FIG. 13B, actuator 604 is configured to displace device 602 in direction 612 until device 602 contacts layer 610. After device 602 contacts layer 610, actuator or actuators 606 displace pins 608 to contact and penetrate layer 610. Thus, device 602 is stabilized when pins 608 contact layer 610, preventing scratching or scrubbing of layer 610, which would occurs if device 602 were oscillating when pins 608 contacted layer 610.

Figure 14A:
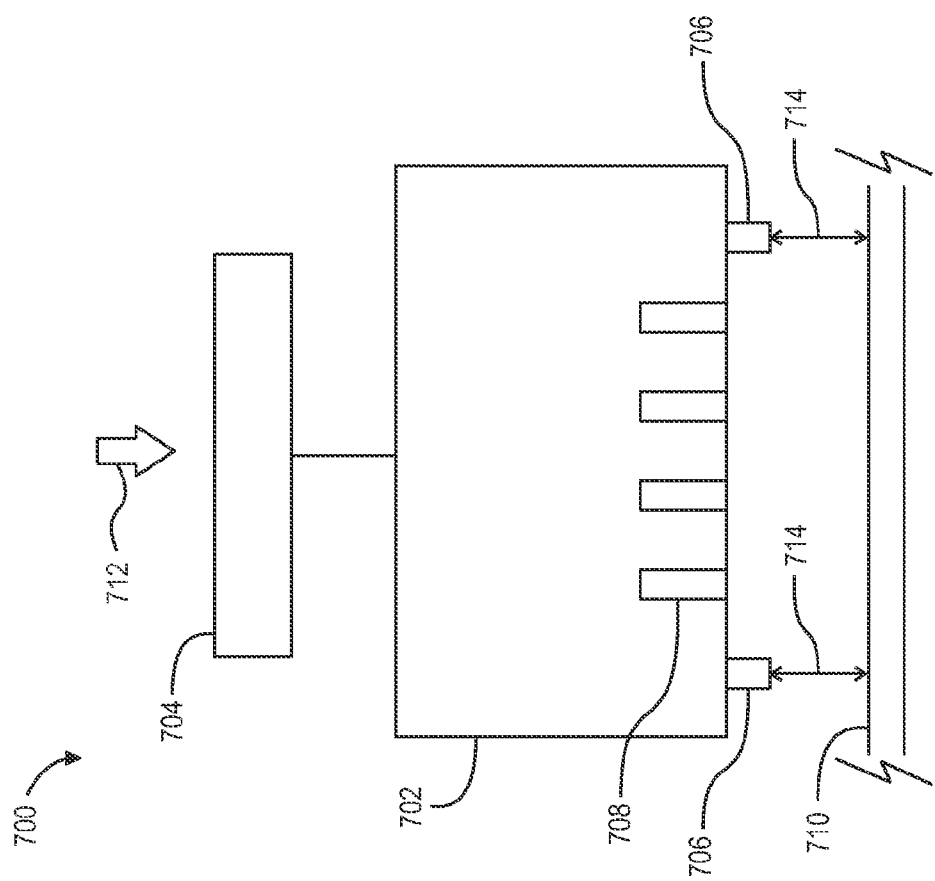
FIG. 14A is a block diagram of a probe pine device assembly with a proximity sensor; and, FIG. 14B is a schematic bottom view of the assembly in FIG. 14A.

FIG. 14A is a block diagram of probe pine device assembly 700 with at least one proximity sensor.

Figure 14B:
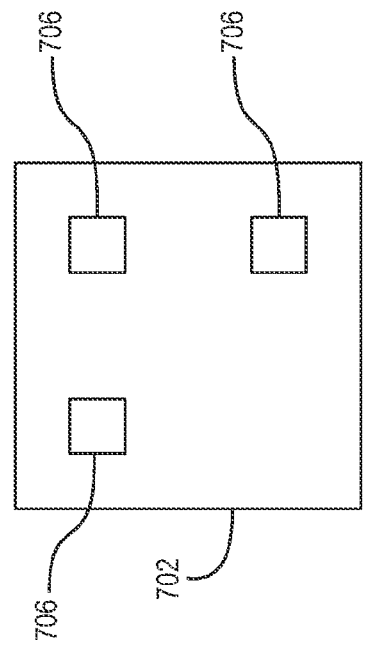

FIG. 14B is a schematic bottom view of assembly 700. Assembly 700 includes probe pin device 702 and actuator 704. Device 702 includes at least one proximity sensor 706 and probe pins 708 at least partially disposed in device 702 and configured to measure a property of conductive layer 710. As device 702 is displaced in direction 712 by the actuator, the at least one sensor 706 measures distance 714 between device 702 and layer 710. Actuator 704 is used the measured position to control displacement of device 702. For example, the speed with which device 702 is displaced toward layer 710 is controlled according to distance 714. For example, as 702 approaches layer 710, the speed of displacement of device 702 is reduced. In an example embodiment, device 702 includes three sensors 706 and the three sensors are used to measure a levelness of device 702 and adjust the displacement and positioning of device 702 accordingly.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A continuous variable spacing probe pin device, comprising:
    a first probe pin;
    a second probe pin; and,
    an actuator; wherein:
        the first and second probe pins are configured to measure a property of a conductive layer;
        in a first configuration of the device, the first and second probe pins include respective first portions arranged to contact the conductive layer to measure the property;
        in a second configuration of the device, the first and second probe pins include respective second portions arranged to contact the conductive layer to measure the property; and,
        a first area of each respective first portion is of a different size than a second area of each respective second portion;
        to transition between the first and second configurations, the actuator is arranged to roll respective first and second outer surfaces of the first and second probe pins, respectively, along the conductive layer while maintaining contact of the first and second probe pins with the conductive layer.

2. The continuous variable spacing probe pin device of claim 1, wherein:
    a first area of contact between the first outer surface and the conductive layer varies as the first outer surface is rolled along the conductive layer;
    a second area of contact between the second outer surface and the conductive layer varies as the second outer surface is rolled along the conductive layer; and,
    the first and second areas of contact vary equally as the first and second outer surfaces are rolled along the conductive layer.

3. The continuous variable spacing probe pin device of claim 1, wherein:
    the respective first portions are separated by a first distance; and,
    the respective second portions are separated by a second distance different from the first distance.

4. The continuous variable spacing probe pin device of claim 1, wherein:
    the respective first portions are separated by a first distance;
    the respective second portions are separated by a second distance greater than the first distance; and,
    a first contact resistance between the first portions and the conductive layer is greater than a second contact resistance between the second portions and the conductive layer.

5. The continuous variable spacing probe pin device of claim 1, wherein:
    the first probe pin including a first contact point, a first end, and a first outer surface connecting the first contact point and the first end;
    the second probe pin:
        is diametrically disposed, with respect to a central axis, from the first probe pin; and,
        includes a second contact point, a second end, and a second outer surface connecting the second contact point and the second end;
    the central axis is parallel to and included in a plane passing through the first and second contact points and the first and second ends;
    a width of the first outer surface progressively varies, in a direction orthogonal to the plane, between the first contact point and the first end; and,
    a width of the second outer surface progressively varies, in a direction orthogonal to the plane, between the second contact point and the second end.

6. The variable spacing probe pin device of claim 1, further comprising:
   third and fourth probe pins, wherein:
   the first and second pins are diametrically opposed to each other with respect to a central axis;
   the third and fourth pins are diametrically opposed to each other with respect to the central axis;
   the third and fourth probe pins are configured to measure the property of the conductive layer;
   in the first configuration of the device, the third and fourth probe pins include respective third portions arranged to contact the conductive layer to measure the property;
   in the second configuration of the device, the third and fourth probe pins include respective fourth portions arranged to contact the conductive layer to measure the property; and,
   a third area of each respective third portion is of a different size than a fourth area of each respective fourth portion.

7. The continuous variable spacing probe pin device of claim 6, wherein:
   the respective first portions are separated by a first distance;
   the respective second portions are separated by a second distance;
   the respective third portions are separated by a third distance;
   the respective fourth portions are separated by a fourth distance;
   the first and third distances are equal and different from the second and fourth distances; and
   the second and fourth distances are equal.

8. A continuous variable spacing probe pin device, comprising:
   a first probe pin including a first outer surface;
   a second probe pin including a second outer surface; and,
   an actuator, wherein:
   the first and second probe pins are configured to measure a property of a conductive layer;
   the actuator is arranged to roll the first and second outer surfaces along the conductive layer, while maintaining contact of the first and second probe pins with the conductive layer, between first and second configurations of the device;
   in the first configuration of the device, respective first portions of the first and second outer surfaces in contact with the conductive layer are separated by a first distance;
   in the second configuration of the device, respective second portions of the first and second outer surfaces in contact with the conductive layer are separated by a second distance different from the first distance; and
   each respective first portion has a first area that differs in size from a second area of each respective second portion.

9. The continuous variable spacing probe pin device of claim 8, further comprising:
   a third probe pin including a third outer surface; and,
   a fourth probe pin including a fourth outer surface, wherein:
   the first and second pins are diametrically opposed to each other with respect to a central axis;
   the third and fourth pins are diametrically opposed to each other with respect to the central axis;
   the third and fourth probe pins are configured to measure the property of the conductive layer;
   the actuator is arranged to roll the third and fourth outer surfaces along the conductive layer, while maintaining contact of the third and fourth probe pins with the conductive layer, between the first and second configurations;
   in the first configuration, respective third portions of the third and fourth outer surfaces in contact with the conductive layer are separated by the first distance; and,
   in the second configuration, respective fourth portions of the third and fourth outer surfaces in contact with the conductive layer are separated by the second distance.

10. The continuous variable spacing probe pin device of claim 9, wherein:
    as the actuator rolls the first, second, third, and fourth outer surfaces along the conductive layer, while maintaining contact of the first, second, third, and fourth probe pins with the conductive layer, a third distance between respective areas of contact between the first and second outer surfaces and the conductive layer and a fourth distance between respective areas of contact between the third and fourth outer surfaces and the conductive layer remain equal.

11. A method of measuring a property of a conductive layer using a continuous variable spacing probe pin device including a first probe pin and a second probe pin, the first and second probe pins configured to measure the property, the method comprising:
    contacting the conductive layer with the first and second probe pins such that first respective equal areas of the first and second probes are in contact with the conductive layer; and,
    rolling the first and second probe pins along the conductive layer such that second respective equal areas of the first and second probes are in contact with the conductive layer, wherein:
    the first respective equal areas are different in size from the second respective equal areas.

12. The method of claim 11, wherein:
    rolling the first and second probe pins along the conductive layer includes maintaining contact between the first and second probe pins and the conductive layer.

13. The method of claim 11, wherein:
    rolling the first and second probe pins along the conductive layer includes:
    equally varying respective areas of contact between the first and second outer surfaces and the conductive layer.

14. The method of claim 11, wherein the first and second probe pins are diametrically opposed to each other with respect to a central axis, the method further comprising:
    contacting the conductive layer with the third and fourth probe pins such that:
    third respective equal areas of the third and fourth probes are in contact with the conductive layer; and,
    the third and fourth probe pins are diametrically opposed to each other with respect to the central axis; and,
    rolling the third and fourth probes along the conductive layer such that:
    fourth respective equal areas of the third and fourth probes are in contact with the conductive layer; and,
    the third respective equal areas are different in size from the fourth respective equal areas.

* * * * *